(12) United States Patent
Tateda et al.

(10) Patent No.: US 10,401,415 B2
(45) Date of Patent: Sep. 3, 2019

(54) MOTOR DRIVE APPARATUS TO DETECT INVERTER WITH LARGE LEAKAGE CURRENT

(71) Applicant: FANUC CORPORATION, Yamanashi (JP)

(72) Inventors: Masaya Tateda, Yamanashi (JP); Yasuyuki Matsumoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/982,182

(22) Filed: May 17, 2018

(65) Prior Publication Data
US 2018/0348284 A1    Dec. 6, 2018

(30) Foreign Application Priority Data

May 30, 2017 (JP) ................. 2017-106819

(51) Int. Cl.
*G01R 19/18* (2006.01)
*G01R 31/02* (2006.01)
(Continued)

(52) U.S. Cl.
CPC ....... *G01R 31/028* (2013.01); *G01R 19/0015* (2013.01); *G01R 19/04* (2013.01);
(Continued)

(58) Field of Classification Search
CPC  G01R 31/025; G01R 31/028; G01R 19/0015; G01R 19/04; G01R 19/10; G01R 19/16571; G01R 27/2605; H02M 7/493; H02M 5/458; H02M 5/4585; H02P 29/024; H02P 29/028; H02P 29/66; H02P 29/662; H02P 27/06; H02P 7/28
See application file for complete search history.

(56) References Cited

U.S. PATENT DOCUMENTS 9,696,743 B1 * 7/2017 Treichler ................. G05F 3/02
9,762,171 B2    9/2017 Tateda et al.
(Continued)

FOREIGN PATENT DOCUMENTS

CN      1641996 A    7/2005
CN    102957376 A    3/2013
(Continued)

*Primary Examiner* — Thang X Le
(74) *Attorney, Agent, or Firm* — RatnerPrestia (57) ABSTRACT

A motor drive apparatus includes a converter, a DC link capacitor, a plurality of inverters, a diagnosis command unit configured to give a command to one of the plurality of inverters to perform power conversion, an AC voltage detection unit configured to detect a peak value of AC voltage on an AC input side of the converter, a DC voltage detection unit configured to detect a value of DC voltage across the DC link capacitor, a calculation unit to calculate a difference between the value of DC voltage and the peak value of AC voltage, a storage unit configured to store the difference in association with the inverters, and a leakage current determination unit configured to determine that the inverter associated with the largest of the differences stored in the storage unit is the inverter that has caused the largest leakage current.

2 Claims, 9 Drawing Sheets

(51) Int. Cl.
*H02M 7/493* (2007.01)
*G01R 19/00* (2006.01)
*G01R 27/26* (2006.01)
*G01R 19/10* (2006.01)
*H02P 27/06* (2006.01)
*G01R 19/04* (2006.01)
*H02M 5/458* (2006.01)
*H02P 5/74* (2006.01)
*H02P 29/032* (2016.01)
*H02P 29/024* (2016.01)

(52) U.S. Cl.
CPC ......... *G01R 19/10* (2013.01); *G01R 27/2605* (2013.01); *H02M 5/458* (2013.01); *H02M 7/493* (2013.01); *H02P 5/74* (2013.01); *H02P 27/06* (2013.01); *H02P 29/0241* (2016.02); *H02P 29/032* (2016.02)

(56) References Cited

U.S. PATENT DOCUMENTS

| | | | |
|---|---|---|---|
| 9,812,947 | B2 | 11/2017 | Yamamoto et al. |
| 9,859,821 | B2 | 1/2018 | Yamamoto |
| 2005/0151658 | A1 | 7/2005 | Kono et al. |
| 2010/0014323 | A1* | 1/2010 | Sato ............... H02M 5/458 363/17 |
| 2011/0317455 | A1* | 12/2011 | Azuma ............ H02M 7/48 363/37 |
| 2013/0215538 | A1* | 8/2013 | Gotou ............. H02H 3/16 361/42 |
| 2016/0134102 | A1* | 5/2016 | Bieniek .......... H02S 50/00 363/55 |
| 2017/0131341 | A1* | 5/2017 | Hu ................. G01R 31/025 |
| 2017/0331407 | A1* | 11/2017 | Hirata ............ H02P 6/12 |
| 2018/0159439 | A1* | 6/2018 | Mukunoki ...... H02M 7/48 |

FOREIGN PATENT DOCUMENTS

| | | |
|---|---|---|
| CN | 104901589 A | 9/2015 |
| CN | 105450145 A | 3/2016 |
| JP | 2001-211653 A | 8/2001 |
| JP | 2008-086154 A | 4/2008 |
| JP | 2009-115754 A | 5/2009 |
| JP | 2014036467 A | 2/2014 |
| JP | 2015087217 A | 5/2015 |
| JP | 2015169479 A | 9/2015 |
| JP | 2016208773 A | 12/2016 |

* cited by examiner

MOTOR DRIVE APPARATUS TO DETECT INVERTER WITH LARGE LEAKAGE CURRENT

CROSS-REFERENCE TO RELATED APPLICATION

This application is a new U.S. Patent Application that claims benefit of Japanese Patent Application No. 2017-106819, filed May 30, 2017, the disclosure of this application is being incorporated herein by reference in its entirety for all purposes.

BACKGROUND OF THE INVENTION

1. Field of the Invention

The present invention relates to a motor drive apparatus to detect an inverter with a large leakage current.

2. Description of the Related Art

Motor drive apparatuses to drive motors in machine tools, forming machinery, injection molding machines, industrial machinery, or various kinds of robots convert AC power supplied by an AC power supply to DC power by a converter and then convert the DC power to AC power by an inverter and use this AC power as the driving power for the motors respectively provided for drive axes. The number of the inverters provided is the same as that of the motors since the inverters individually supply driving power to drive the motors, respectively provided for a plurality of drive axes. In contrast, only one converter is provided for a plurality of inverters in most cases to reduce cost and occupied space.

In this type of motor drive apparatuses, when PWM switching control is performed on the inverters, the presence of stray capacitance with motors, motor power cables, and the like causes leakage current. It is important to address the problem of leakage current because leakage current may cause a malfunction or damage in the motor drive apparatus or its peripheral devices.

For example, Japanese Unexamined Patent Publication (Kokai) No. 2001-211653 discloses a method of reducing leakage current in a multi-axis drive apparatus provided with a plurality of drive circuits each including a driving unit employing a motor and a conversion circuit including a semiconductor switching device to control the driving unit and with a control device to control switching timings of the semiconductor switching devices in the conversion circuits, the method including: individually measuring patterns of leakage currents produced in the drive circuits in advance; and selecting in advance a combination of patters of leakage currents that can cancel each other from among the patterns of leakage currents measured, wherein the control device controls the switching timings of the switching devices in the conversion circuits so that the patterns of leakage currents of the selected combination can cancel each other.

For example, Japanese Unexamined Patent Publication (Kokai) No. 2009-115754 discloses a leakage current measuring device for an electric appliance, the device including: a voltage-to-ground measuring means for measuring voltages to ground of all three phases of a switching power supply to drive the electric appliance; a zero-phase current measuring means for measuring zero-phase current, which is leakage current to ground flowing through the electric appliance including a wire and/or a motor receiving electricity supplied by the switching power supply; a signal processing means for calculating phase differences between the voltage to ground in each phase measured by the voltage-to-ground measuring means and the zero-phase current measured by the zero-phase current measuring means; and a calculation means for calculating a leakage current flowing through an insulation resistor to ground from the values of the phase differences calculated by the signal processing means, the voltages to ground measured by the voltage-to-ground measuring means, the zero-phase current measured by the zero-phase current measuring means, and a rated voltage to ground of the electric appliance.

For example, Japanese Unexamined Patent Publication (Kokai) No. 2008-086154 discloses a method of reducing leakage current of an inverter, the method including controlling conduction/non-conduction of a switch connected between ground and a connection point of a first capacitor and a second capacitor provided between the inverter to drive a load and an AC power supply connected to the inverter, wherein the first capacitor and the second capacitor are in series connection and connected across output lines of the AC power supply.

SUMMARY OF INVENTION

To address the problem of leakage current, the leakage current needs to be measured. The leakage current is caused by a high-speed PWM switching control of the inverters to supply the motor with driving power under the presence of stray capacitance and accordingly has a very high frequency. Hence, it is very difficult to measure the leakage current itself directly. When an inverter is used to drive a motor, a leakage current of a certain intensity, large or small, is produced. With a motor drive apparatus employing a plurality of inverters to supply driving power to a plurality of motors, it is very important to know the combination of an inverter and a motor that causes the largest leakage current to apply effective measures to the motor drive apparatus to address the problem of leakage current. Thus, technology of detecting easily and accurately the combination of an inverter and a motor that causes the largest leakage current is desired.

According to one aspect of the present disclosure, a motor drive apparatus includes a converter configured to convert AC power inputted by an AC power supply to DC power and to output the DC power to a DC link, a DC link capacitor provided for the DC link, a plurality of inverters respectively provided for motors and configured to perform power conversion operation in accordance with a command received to convert the DC power in the DC link to AC power for driving the motors, a diagnosis command unit configured to execute processing for giving a command to only one inverter of the plurality of inverters at a time to perform the power conversion operation and to repeat the processing for the other inverters of the plurality of inverters one after another, an AC voltage detection unit configured to detect a peak value of AC voltage on an AC input side of the converter, a DC voltage detection unit configured to detect a value of DC voltage applied across the DC link capacitor, a calculation unit configured to calculate a difference between the value of DC voltage detected by the DC voltage detection unit and the peak value of AC voltage detected by the AC voltage detection unit, a storage unit configured to store the difference calculated by the calculation unit in association with the inverter that had been commanded by the diagnosis command unit to perform the power conversion operation when the value of DC voltage used for the calculation of the difference was detected by the DC voltage detection unit, and a leakage current determination unit configured to determine that the inverter stored in association with the largest of the differences stored in the storage unit is the inverter that has caused the largest leakage current.

BRIEF DESCRIPTION OF THE DRAWINGS

The present invention will be more clearly understood with reference to the following accompanying drawings.

DETAILED DESCRIPTION

With reference to the drawings, a motor drive apparatus to detect an inverter with a large leakage current will now be described. In the drawings, like members are denoted by like reference numerals. Constituent features denoted by the same reference numerals in different drawings are to be understood to have the same functions. Further, the drawings are presented in various scales to aid the readers' understanding. Note that driving a motor generally causes leakage current of a certain intensity, large or small, but in the present disclosure, "a leakage current that would cause a malfunction or damage has occurred" may be simply expressed as "a leakage current has occurred" or "an occurrence of leakage current" while "no leakage current that would cause a malfunction or damage has occurred" may be simply expressed as "no leakage current has occurred" or "no occurrence of leakage current".

Figure 1:
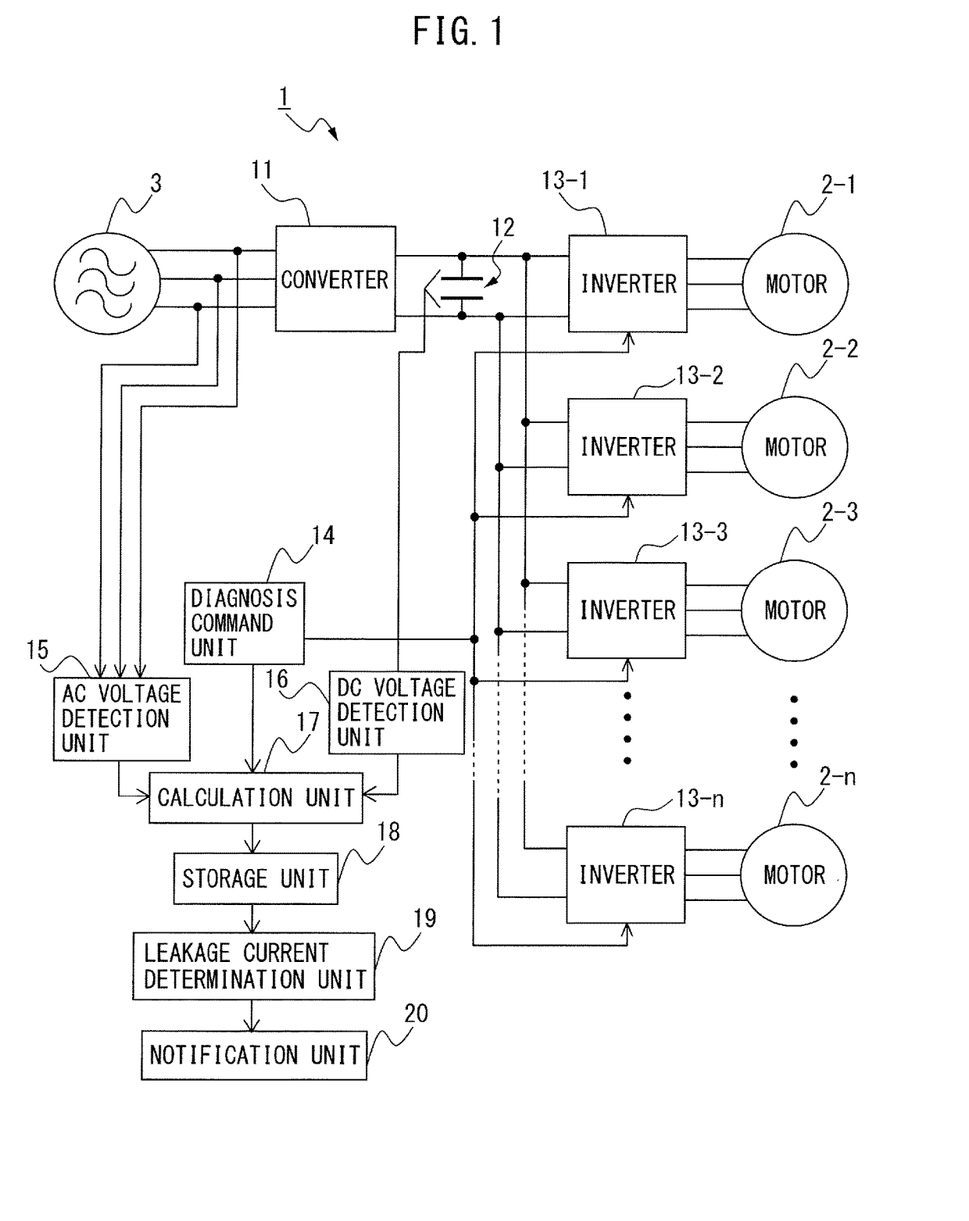
FIG. 1 illustrates a motor drive apparatus according to an embodiment.

FIG. 1 illustrates a motor drive apparatus according to an embodiment. As an example, a case in which the motor drive apparatus 1 controls a plurality of three-phase AC motors 2-$n$ (n is a positive integer) will be described. The present embodiment is not limited to motors 2-$n$ of a particular type; the motors may be, for example, induction motors or synchronous motors. Further, the present embodiment is not limited to an AC power supply 3 and motors 2 adapted to a particular number of phases; a single-phase power supply and single-phase motors may be used. According to the embodiment illustrated in FIG. 1, the AC power supply 3 is a three-phase AC power supply and the motors 2-$n$ are three-phase AC motors.

Before describing a servo motor drive apparatus 1 according to an embodiment, the drive control of the motors 2 will be described first. Similar to common motor drive apparatuses, the motor drive apparatus 1 controls inverters 13-$n$ (n is a positive integer) that perform power conversion between DC power of a DC link and AC power that is a driving power or a regenerative power of the motors 2-$n$. Based on the speeds of (the rotors of) the motors 2-$n$ (speed feedback), currents through wirings of the motors 2-$n$ (current feedback), designated torque commands, an operation program for the motors 2-$n$, and the like, the motor drive apparatus 1 generates switching commands for controlling the speeds, torques, or positions of the rotors of the motors 2-$n$ in, for example, a superordinate controller (not illustrated). The power conversion operation by the inverters 13-$n$ is controlled in accordance with the switching commands generated by the motor drive apparatus 1.

As illustrated in FIG. 1, the motor drive apparatus 1 according to an embodiment includes a converter 11, a DC link capacitor 12, inverters 13-$n$ (n is a positive integer), a diagnosis command unit 14, an AC voltage detection unit 15, a DC voltage detection unit 16, a calculation unit 17, a storage unit 18, and a leakage current determination unit 19. The motor drive apparatus 1 also includes a notification unit 20 configured to notify results of determination by the leakage current determination unit 19. The phases of the three-phase AC power supply 3 are referred to as R-phase, S-phase, and T-phase and N denotes a ground point.

The motor drive apparatus 1 according to an embodiment includes one converter 11. The converter 11 converts the AC power inputted by the three-phase AC power supply 3 to DC power and outputs the DC power to the DC link. The converter 11 may be, for example, a diode rectifying circuit, a 120-degree conduction rectifying circuit, a PWM switching control rectifying circuit with switching devices inside, or the like. When the converter 11 is a diode rectifying circuit, the converter 11 rectifies the AC current inputted by the AC power supply 3 and outputs a DC current to the DC link, which is on the DC side. When the converter 11 is a 120-degree conduction rectifying circuit or a PWM switching control rectifying circuit, the converter 11 can be realized as a power converter capable of converting AC and DC powers in both directions, converting the AC power inputted by the AC power supply 3 to DC power and outputting the DC power to the DC side as well as converting DC power in the DC link to AC power and returning the AC power to the AC power supply 3 when the motors slow down. When the converter 11 is a PWM switching control rectifying circuit, the converter 11 includes bridge circuits of switching devices and diodes in antiparallel connection. In this case, the switching devices may be, for example, IGBTs, thyristors, GTOs (Gate turn-off thyristors), transistors, or the like but the present embodiment is not limited to a particular type of switching devices and other types of switching devices may be used.

The DC link capacitor (also referred to as a smoothing capacitor) 12 is provided for the DC link connecting the DC output side of the converter 11 with the DC input side of the inverters 13-$n$. The DC link capacitor 12 performs a function of reducing ripples of the DC output of the converter 11 and storing DC power in the DC link.

The inverters 13-$n$ individually supply driving power to a plurality of motors 2-$n$ to drive the motors 2-$n$; therefore, for example, the number of the inverters provided (n in the illustrated example) is the same as the number of the motors 2-$n$.

The inverters 13-$n$ are connected with the DC link and perform power conversion between DC power in the DC link and AC power that is driving power or regenerative power of the motors 2-$n$ as the switching devices are on-off controlled in accordance with the switching commands received from a superordinate controller (not illustrated). The inverters 13-$n$ include bridge circuits of switching devices and diodes in antiparallel connection and the switching devices are on-off controlled by, for example, a PWM switching control method. The switching devices may be, for example, FETs or other unipolar transistors, bipolar transistors, IGBTs, thyristors, GTOs or the like but the present embodiment is not limited to a particular type of switching devices and other types of switching devices may be used. According to the present embodiment, as the motors 2-$n$ connected to the motor drive apparatus 1 are three-phase AC motors, the inverters 13-$n$ are configured as three-phase bridge circuits; when the motors 2-$n$ are single-phase motors, the inverters 13-$n$ are configured as single-phase bridge circuits.

In the normal operation mode for operating the motors 2-$n$, the inverters 13-$n$ convert the DC power supplied by the converter 11 through the DC link to AC power of a desired voltage and a desired frequency to drive the motors 2-$n$, by the switching operations of the switching devices therein in accordance with the switching commands received from the superordinate controller, and output the DC power (inversion operation). The motors 2-$n$ thus operate on the supplied AC power of variable voltage and variable frequency. Regenerative power is generated when the motors 2-$n$ slow down and the inverters 12-$n$ convert regenerative AC power generated by the motors 2-$n$ to DC power, by the switching operations of the switching devices therein in accordance with the switching commands received from the superordinate controller, and return the DC power to the DC link (conversion operation). According to one aspect of the present disclosure, which will be described later in detail, not in the operation mode for operating the motors 2-$n$ but in a mode for determining (identifying) an inverter with a large leakage current (hereinafter referred to as "the diagnosis mode"), the diagnosis command unit 14 executes the processing for causing only one inverter of the plurality of inverters 13-$n$ at a time to perform power conversion operation and repeats the processing for the other inverters one after another.

In the diagnosis mode, the diagnosis command unit 14 executes processing for giving a command to only one inverter of the plurality of inverters 13-$n$ at a time to perform power conversion operation and repeats the processing for the other inverters 13-$n$ one after another. More specifically, the diagnosis command unit 14 outputs a command to one inverter to convert DC power in the DC link to AC driving power by the switching operations of the switching devices (on/off switching command) while outputting commands to the inverters other than the one inverter not to convert any DC power supplied by the converter 11 to AC power (i.e., off-only switching command). The diagnosis command unit 14 executes this command processing on the plurality of inverters 13-$n$ one at a time. Thus, in the diagnosis mode, only one inverter at a time performs power conversion operation; therefore, only the motor connected to the one inverter performing power conversion operation is driven.

The AC voltage detection unit 15 detects a peak value of AC voltage on the AC input side of the converter 11. The peak value of an AC voltage is $\sqrt{2}$ times the effective value of the AC voltage. The peak value of AC voltage detected by the AC voltage detection unit 15 is sent to the calculation unit 17.

The DC voltage detection unit 16 detects a value of DC voltage applied across the DC link capacitor 12. The value of DC voltage detected by the DC voltage detection unit 16 is sent to the calculation unit 17.

The calculation unit 17 calculates the difference between the value of DC voltage detected by the DC voltage detection unit 16 and the peak value of AC voltage detected by the AC voltage detection unit 15. Details of the calculation processing by the calculation unit 17 will be described later.

The storage unit 18 stores the difference calculated by the calculation unit 17 in association with the inverter that had been commanded to perform power conversion operation by the diagnosis command unit 14 when the DC voltage detection unit 16 detected the value of DC voltage used for the calculation of the difference. As describe above, at any one moment in the diagnosis mode, only one inverter performs power conversion operation; therefore only the motor connected to the one inverter performing power conversion operation is driven. Hence, the AC voltage detection unit 15 detects the peak value of AC voltage on the AC input side of the converter 11 when the motor connected to the one inverter performing power conversion operation is driven and the DC voltage detection unit 16 detects a value of DC voltage applied across the DC link capacitor 12 when the motor connected to the one inverter performing power conversion operation is driven. The calculation unit 17 calculates the difference between the value of DC voltage detected by the DC voltage detection unit 16 and the peak value of AC voltage detected by the AC voltage detection unit 15 when the motor connected to the one inverter performing power conversion operation is driven. The storage unit 18 stores the difference calculated by the calculation unit 17 together with identity information of the inverter that had been commanded to perform power conversion operation by the diagnosis command unit 14. The storage unit 18 includes, for example, electrically erasable and recordable non-volatile memory such as, for example, EEPROM (registered trademark) or random access memory readable and writable at a high speed such as, for example, DRAM or SRAM. Alternatively, the storage unit 18 may be provided in a region of a storage device used by the motor drive apparatus 1 for driving the motors 2-$n$ in the normal operation mode. Details of the storage processing by the storage unit 18 will be described later.

The leakage current determination unit 19 determines that the inverter stored in association with the largest of the differences stored in the storage unit 18 (in other words, the inverter that had been commanded to perform power conversion operation by the diagnosis command unit 14 when the DC voltage detection unit 16 detected the value of DC voltage used for the calculation of the largest difference by the calculation unit 17) is the inverter that caused the largest leakage current. The result of determination by the leakage current determination unit 19 allows the user of the motor drive apparatus 1 to identify the inverter determined to have caused the largest leakage current. Details of the processing of leakage current determination by the leakage current determination unit 19 will be described later.

The notification unit 20 notifies the identity information of the inverter determined by the leakage current determination unit 19 to have caused the largest leakage current. The notification unit 20 may be, for example, a display device of a personal computer, a mobile terminal, a touch panel, or the like or a display device mounted to a numerical control apparatus (not illustrated) provided in the motor drive apparatus 1. For example, the identity information of the inverter determined to have caused the largest leakage current is displayed on the display device, for example, in letters or pictures. Further, for example, the notification unit 20 may be realized as an audio device producing voice or sound such as a speaker, a buzzer, or chimes to notify by sound the identity information of the inverter determined to have caused the largest leakage current. Further, the notification unit 20 may print information on a sheet of paper or the like by using a printer; for example, the identity information of the inverter determined to have caused the largest leakage current may be displayed with the time when the leakage current occurred. Further still, the notification unit 20 may be realized by combining these means as appropriate. In addition, data on the result of determination outputted by the leakage current determination unit 19 may be stored in a storage device and further utilized for other purposes.

The result of determination by the leakage current determination unit 19 allows the user of the motor drive apparatus 1 to identify easily and accurately the inverter determined to have caused the largest leakage current. For example, the user who has identified the "inverter determined to have caused the largest leakage current" by means of the notification unit 20 can, for example, carry out an alteration in the design such as replacing a cable connected to the motor that is connected to the inverter in question or a cable connecting the AC power supply 3 with the motor drive apparatus 1 with a thicker cable. Further, a noise absorption circuit (not illustrated) may be provided in the motor drive apparatus 1 for absorbing noise generated on the AC input side of the converter 11 (i.e., between the AC power supply 3 and the converter 11). The user who has learned that "a leakage current (that would cause a malfunction or damage) has occurred" by means of the notification unit 20 can also carry out an alteration in the design such as replacing this noise absorption circuit with one having different noise absorption characteristics.

The above-described diagnosis command unit 14, the AC voltage detection unit 15, the DC voltage detection unit 16, the calculation unit 17, the storage unit 18, the leakage current determination unit 19, and the notification unit 20 may be realized, for example, by a software program or a combination of electronic circuits of various kinds and a software program. When, for example, these units are realized by a software program, the above-described functions of these units are realized by causing a computer to operate in accordance with the software program or by causing the arithmetic processing unit provided in a numerical control apparatus connected with the motor drive apparatus 1 to execute this software program. Alternatively, the diagnosis command unit 14, the AC voltage detection unit 15, the DC voltage detection unit 16, the calculation unit 17, the storage unit 18, the leakage current determination unit 19, and the notification unit 20 may be realized by a semiconductor integrated circuit with a software program written therein to carry out the functions of these units.

Further, for example, when a plurality of motor drive apparatuses 1 are provided and the control systems of the motor drive apparatuses 1 are connected via a communication network, results of determination by the leakage current determination units 19 of the motor drive apparatuses 1 may be shared in a cloud server.

Further, for example, when a plurality of manufacturing cells including machine tools each including a motor drive apparatus 1 are connected via a communication network, results of determination by the leakage current determination units 19 of the motor drive apparatuses 1 may be shared by cell controllers superordinate to the manufacturing cells or by a production control apparatus further superordinate to the cell controllers.

A manufacturing cell is a set of machine tools flexibly combined for product manufacturing. A manufacturing cell is formed by, for example, a plurality of machine tools or a plurality of kinds of machine tools, with no limitation on the number of machine tools in a manufacturing cell. For example, a manufacturing cell may be a manufacturing line in which a workpiece is machined by a plurality of machine tools in order and made into a finished product. Further, for example, a manufacturing cell may be a manufacturing line in which two or more articles (components) respectively machined by two or more machine tools are assembled by another machine tool in the manufacturing process into a finished article (product). Further, for example, two or more articles machined in two or more manufacturing cells may be assembled into a finished article (product). Manufacturing cells and cell controllers are communicably connected with each other via a communication network such as an intranet. Manufacturing cells are organized in a factory where the products are manufactured. In contrast, cell controllers may be provided in the factory where manufacturing cells are organized or in a building separate from the factory. For example, cell controllers may be provided in a separate building located on the same premise as the factory where manufacturing cells are organized.

A production control apparatus is provided superordinate to cell controllers. A production control apparatus is mutually communicably connected with cell controllers and gives commands to the cell controllers according to a production plan. A production control apparatus may be provided in an office remotely located from the factory. In such a case, the cell controllers and the production control apparatus are mutually communicably connected via a communication network such as the Internet.

In such a production system, a display device provided in a cell controller or in the production control apparatus may be used as the notification unit 20 and commanded to display "the identity information of the inverter determined to have caused the largest leakage current". Alternatively, instead of or together with the display device, an audio device serving as the notification unit 20 is used to produce an alarm sound or a buzz to notify results of determination to the user. This allows operators or managers working in the factory to easily identify the motor drive apparatus 1 for which a design alteration is desired to reduce leakage current.

The processing for calculating differences by the calculation unit 17, the processing for storing differences by the storage unit 18, and the determination processing by the leakage current determination unit 19 will now be described in detail with reference to FIGS. 2 to 10.

Figure 2:
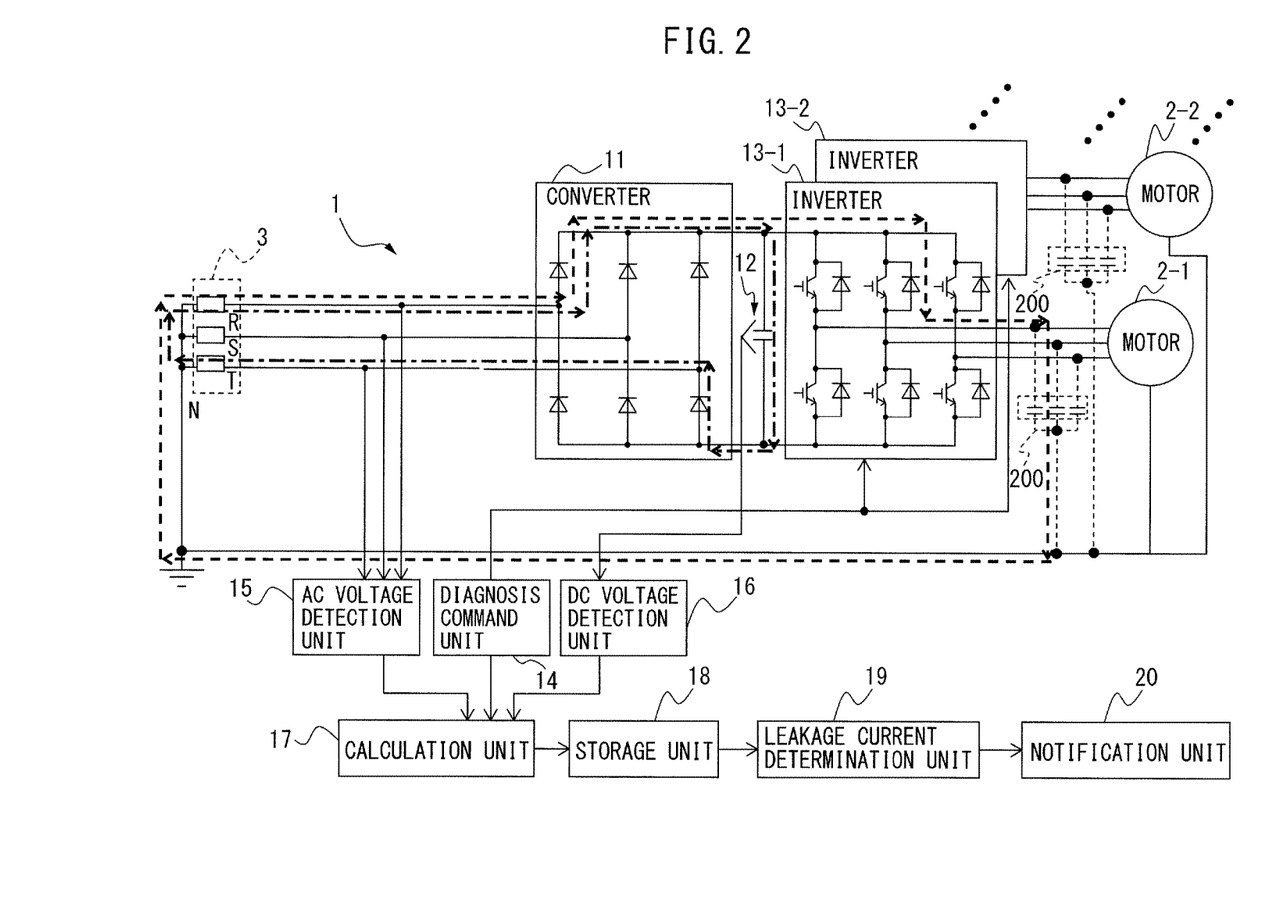
FIG. 2 is a circuit diagram for explaining a current path of a leakage current flowing through a DC link capacitor.

FIG. 2 is a circuit diagram for explaining a current path of a leakage current flowing through a DC link capacitor.

Stray capacitance exists with the motors 2-n, the power supply cables for the motors, and the like. In FIG. 2, stray capacitance is denoted by reference numeral 200. When the switching devices in the inverters 13-n perform high-speed switching operations to supply AC power to drive the motors 2-n, a leakage current flows through the AC power supply 3, the converter 11, the inverters 13-n, and the stray capacitance 200. In FIG. 2, thick dashed lines with arrows illustrate an example path through which flows a leakage current caused by driving the motor 2-1. The current path illustrated in FIG. 2 is simply an example and, in reality, the current path through which flows a leakage current caused by driving the motor 2-1 changes from moment to moment depending on the combinations of on/off states of the switching devices on the upper arm and the lower arm of the inverter 13-1 and other factors.

When a leakage current is caused by driving the motor 2-1, a part of the leakage current flows also to the DC link capacitor 12. In FIG. 2, thick long dashed short dashed lines with arrows illustrate an example path of a leakage current flowing through the DC link capacitor 12 when, for example, the leakage current caused by driving the motor 2-1 flows through the current path depicted by the thick dashed lines with arrows. When the leakage current caused by driving the motor 2-1 takes a different current path in the converter 11, the leakage current flowing to the DC link capacitor 12 accordingly takes a different current path in the converter 11. The flow of leakage current into the DC link capacitor 12 fluctuates the voltage applied across the DC link capacitor 12.

Figure 3A:
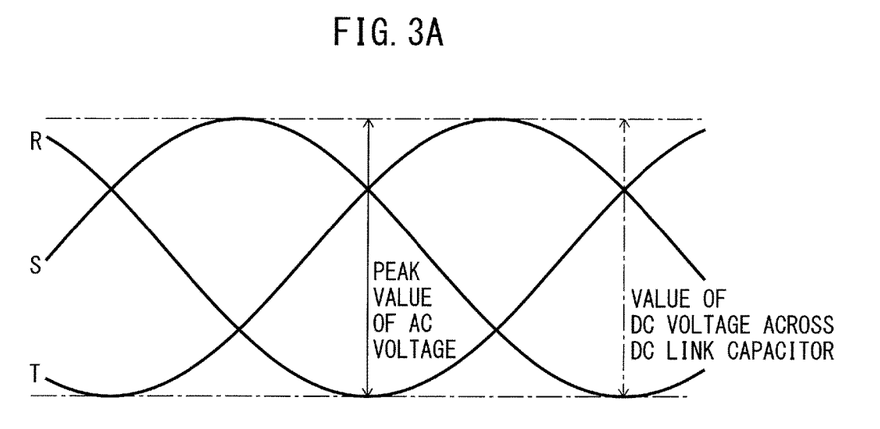
FIG. 3A is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters perform no switching operation.
Figure 3B:
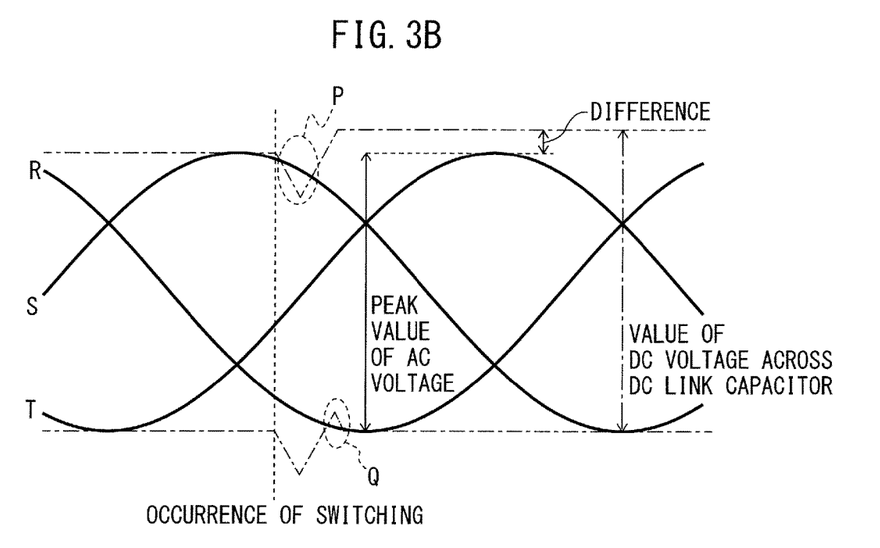
FIG. 3B is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters have performed switching operations.

FIG. 3A is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters perform no switching operation. FIG. 3B is a schematic diagram for explaining a voltage fluctuation across the DC link capacitor caused by an occurrence of leakage current, the diagram illustrating a relation between AC voltage waveforms on the AC input side of the converter and DC voltage waveforms across the DC link capacitor when the switching devices in the inverters have performed switching operations. In FIGS. 3A and 3B, three-phase AC voltage waveforms on the AC input side of the converter 11 are depicted by continuous lines and DC voltage waveforms across the DC link capacitor 12 are depicted by long dashed short dashed lines.

In the motor drive apparatus 1, when the converter 11 converts the AC power inputted by the three-phase (R-phase, S-phase, and T-phase) AC power supply 3 to DC power and outputs the DC power to the DC link and the inverters 13-n perform no power conversion operation, with the switching devices therein performing no switching operation, the value of the DC voltage outputted by the converter 11 to the DC link is equal to the peak value of AC voltage ($\sqrt{2}$ times the effective value of AC voltage) on the AC input side as illustrated in FIG. 3A. When the inverters 13-n subsequently perform power conversion operation, with the switching devices therein performing switching operations, a leakage current flows through the AC power supply 3, the converter 11, the inverters 13-n, and the stray capacitance 200 and a part of the leakage current flows to the DC link capacitor 12. This fluctuates the voltage applied across the DC link capacitor 12 as illustrated in FIG. 3B. In other words, the positive-side DC potential and the negative-side DC potential of the DC link relative to the ground potential fluctuate. Note that, as the DC link capacitor 12 generally has a very large capacitance, the amplitude of the voltage fluctuation is not so great. As illustrated in FIG. 3B, when the voltage applied across the DC link capacitor 12 fluctuates, the peak values of the AC voltage exceed the positive-side DC potential and the negative-side DC potential of the DC link capacitor 12 at certain timings (P and Q in the drawings), when a current occurs, which flows through the AC power supply 3 into the DC link capacitor 12. The current flowing into the DC link capacitor 12 further charges the DC link capacitor 12, resulting in a fluctuation in the voltage applied across the DC link capacitor 12. The relation between the fluctuation of the voltage applied across the DC link capacitor 12 and leakage current is described further in detail in the following.

Figure 4:
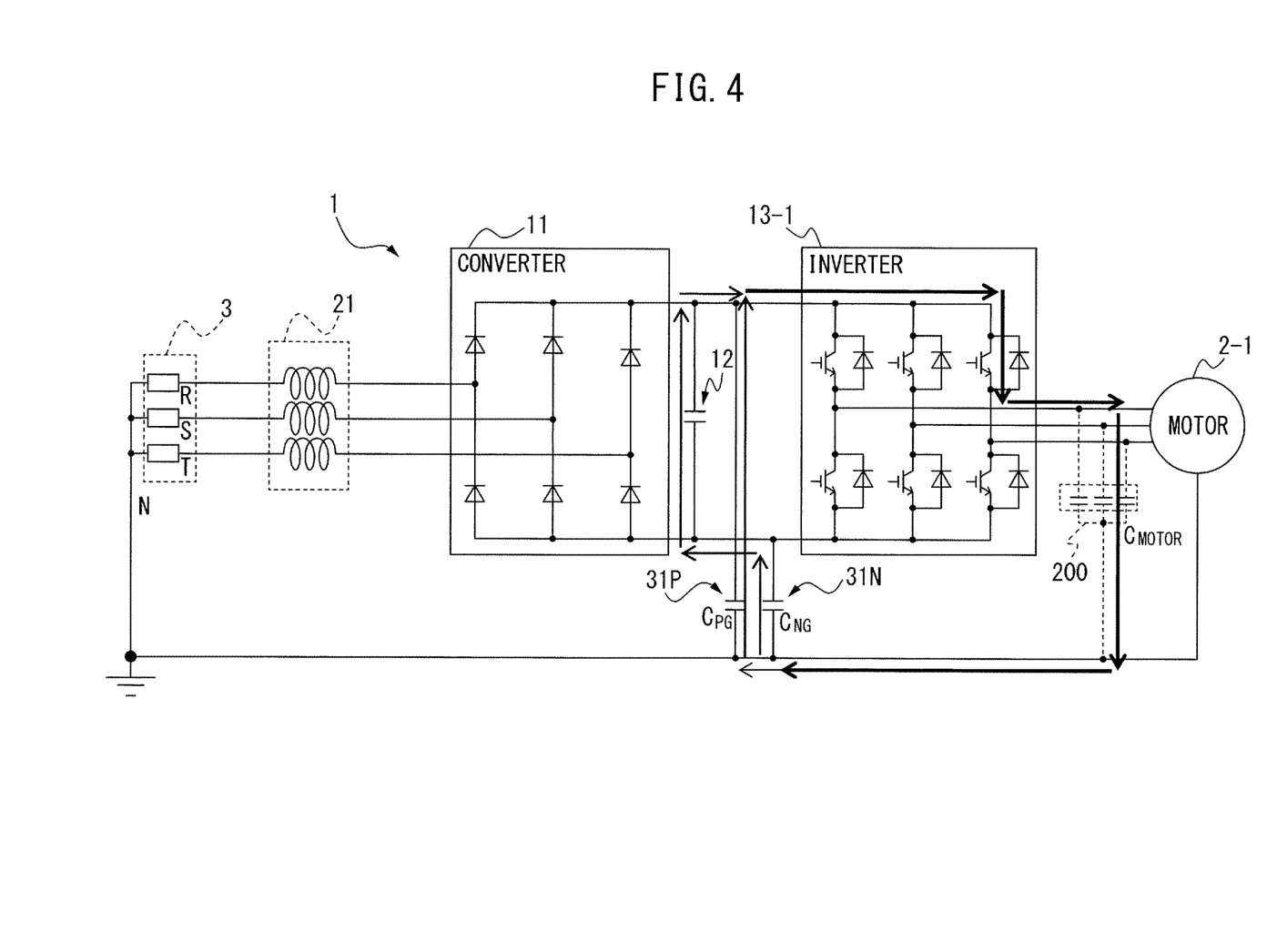
FIG. 4 is a (first) diagram for explaining a flow of current at the time of a voltage fluctuation across the DC link capacitor caused by an occurrence of leakage current.
Figure 5:
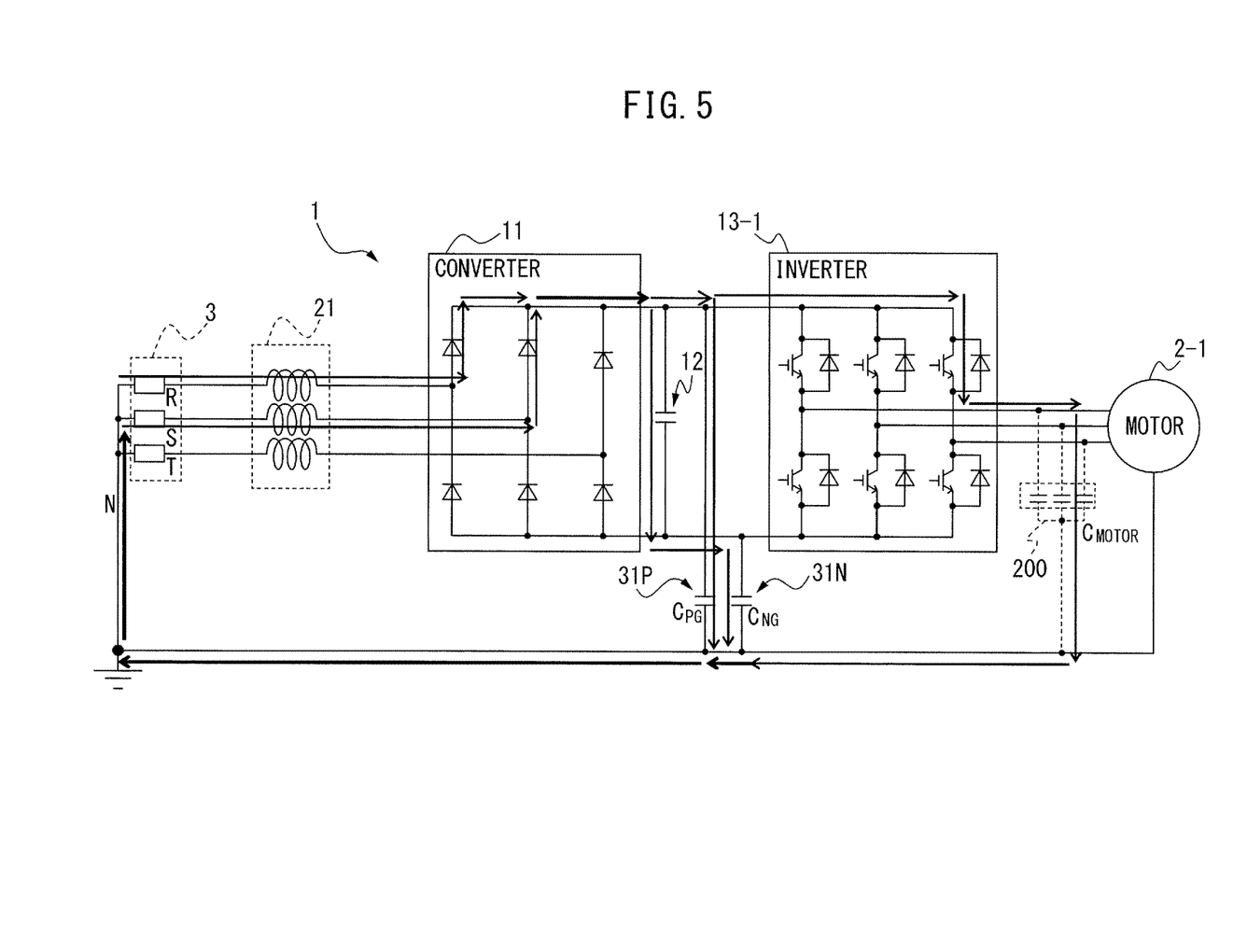
FIG. 5 is a (second) diagram for explaining a flow of current at the time of a voltage fluctuation across the DC link capacitor caused by an occurrence of leakage current.
Figure 6:
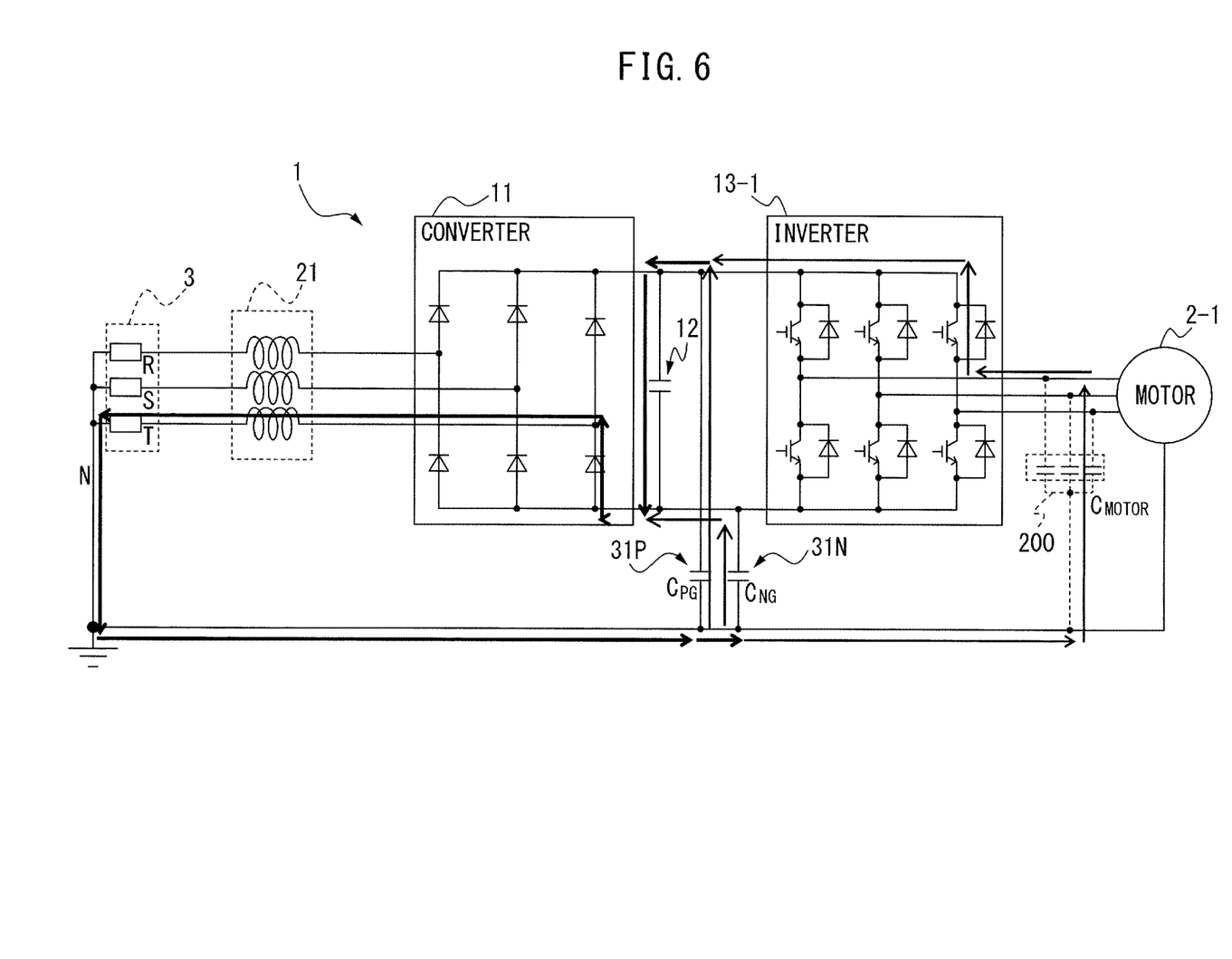
FIG. 6 is a (third) diagram for explaining a flow of current at the time of a voltage fluctuation across the DC link capacitor caused by an occurrence of leakage current.

FIGS. 4 to 6 are diagrams for explaining a flow of current at the time of a voltage fluctuation across the DC link capacitor caused by an occurrence of leakage current. Generally, in the motor drive apparatus 1, AC reactors 21 are provided on the AC input side of the converter 11. Further, Y capacitors (line bypass capacitors) may be connected between the positive-side DC potential and ground and between the negative-side DC potential of the DC link and ground mainly for the purpose of reducing noise. In the examples illustrated in FIGS. 4 to 6, a Y capacitor 31P of capacitance $C_{PG}$ is connected between the positive-side DC potential of the DC link and ground and a Y capacitor 31N of capacitance $C_{NG}$ is connected between the negative-side DC potential of the DC link and ground. $C_{MOTOR}$ is the capacitance of the stray capacitance 200. In the examples illustrated in FIGS. 4 to 6, the motor drive apparatus 1 is assumed to have one motor and one inverter denoted by reference numeral 2-1 and 13-1, respectively, for the sake of simpler description.

When the switching devices in the inverter 13-1 perform high-speed switching operations to supply AC power to drive the motor, a leakage current flows through the AC power supply 3, the converter 11, the inverter 13-1, and the stray capacitance 200. This leakage current also flows through DC capacitor 12 and, as illustrated in FIG. 4, fluctuates the voltage applied across the DC link capacitor 12, i.e., fluctuates the positive-side DC potential and the negative-side DC potential of the DC link relative to the ground potential. When the positive-side DC potential and the negative-side DC potential of the DC link relative to the ground potential fluctuate, a voltage depending on the amplitude of this fluctuation is applied to the AC reactors 21, producing energy in the AC reactors 21, resulting in current flows as illustrated in FIG. 5, and the currents flow into the DC link capacitor 12 and the Y capacitors 31P and 31N. By the effects of the inductance of the Y capacitors 31P and 31N, the positive-side DC potential and the negative-side DC potential of the DC link relative to the ground potential increase, resulting in current flows as illustrated in FIG. 6, which are in reverse direction to the current flows in FIG. 5.

As described above, the positive-side DC potential and the negative-side DC potential of the DC link relative to the ground potential fluctuate due to the transfer of charges between the DC link capacitor 12, the stray capacitance 200, and Y capacitors 31P and 31N during the high-speed switching operations of the switching devices in the inverter 13-1. However, the voltage applied across the DC link capacitor 12 $V_{PN}$ changes very little as the capacitance of the DC link capacitor 12 is far greater than the capacitance of the Y capacitor 31P. Therefore, by approximation, the transfer of charges can be considered to take place between the stray capacitance 200 and the Y capacitors 31P and 31N. When it is assumed that charges are ideally transferred between the stray capacitance 200 and the Y capacitors 31P and 31N, then the charge of the stray capacitance 200 is equal to the discharge of the Y capacitors 31P and 31N. Thus, equation 1 holds where $V_{FALL}$ is the amplitude of voltage fluctuation in the positive-side DC potential or the negative-side DC potential of the DC link relative to the ground potential.

$$C_{MOTOR}(V_{PN}-V_{FALL})=(C_{PG}+C_{NG})V_{FALL} \tag{1}$$

Equation 1 is rearranged as equation 2.

$$V_{FALL} = \frac{C_{MOTOR}V_{PN}}{C_{MOTOR} + C_{PG} + C_{NG}} \tag{2}$$

As can be seen from equation 2, the amplitude of voltage fluctuation $V_{FALL}$ of the positive-side DC potential or the negative-side DC potential of the DC link relative to the ground potential depends on the capacitance $C_{MOTOR}$ of the stray capacitance 200, the capacitance $C_{PG}$ of the Y capacitor 312, and the capacitance $C_{NG}$ of the Y capacitor 31N. In other words, due to the presence of stray capacitance 200, a leakage current occurs during the high-speed switching operations of the switching devices in the inverter 13-1 and fluctuates the positive-side DC potential or the negative-side DC potential of the DC link relative to the ground potential.

As described above, when the converter 11 converts the AC power inputted by the three-phase AC power supply 3 to DC power and outputs the DC power to the DC link and the inverter 13-1 performs no power conversion operation, with the switching devices therein performing no switching operation, the value of the DC voltage outputted by the converter 11 to the DC link side equals to the peak value of AC voltage on the AC input side as illustrated in FIG. 3A. In other words, the value of DC voltage detected by the DC voltage detection unit 16 (i.e., the value of DC voltage applied across the DC link capacitor 12) equals to the peak value of AC voltage detected by the AC voltage detection unit 15 in this case. In contrast, when the switching devices in the inverter 13-1 perform high-speed switching operations, a leakage current occurs and this leakage current fluctuates the voltage applied across the DC link capacitor 12 (FIG. 3B). In this case, the value of DC voltage detected by the DC voltage detection unit 16 (i.e., the value of DC voltage applied across the DC link capacitor 12) increases and exceeds the peak value of AC voltage detected by the AC voltage detection unit 15 and becomes constant after having increased to a certain level. As a result, the value of DC voltage differs from the peak value of AC voltage. According to the present embodiment, an occurrence of leakage current is detected based on the difference between the value of DC voltage detected by the DC voltage detection unit 16 and the peak value of AC voltage detected by the AC voltage detection unit 15. It is reasonable to assume that the difference between the value of DC voltage detected by the DC voltage detection unit 16 and the peak value of AC voltage detected by the AC voltage detection unit 15 is proportional to the intensity of the leakage current. The leakage current determination unit 19 determines the inverter that has caused the largest leakage current based on the difference calculated by the calculation unit 17 (i.e., the amplitude of fluctuation in the value of DC voltage applied across the DC link capacitor 12 compared with the peak value of AC voltage on the AC input side of the converter 11).

The relation between the difference calculated by the calculation unit 17 and the leakage current will now be described. Equation 3 holds wherein ΔV is the increase in the voltage across the DC link capacitor 12, i is the leakage current flowing into the DC link capacitor 12, Q is the increase in the charge of the DC link capacitor 12, and C is the capacitance of the DC link capacitor 12. In equation 3, t is a period of time from the start of an increase in the voltage across the DC link capacitor 12 (i.e., the start of switching operations by the switching devices in the inverter 13-1) to the point in time when the voltage of the DC link capacitor 12 reached an approximately constant value after having made an increase.

$$Q=C\Delta V \tag{3}$$

Equation 3 is rearranged as equation 4.

$$\Delta V = \frac{Q}{C} = \frac{i}{C}t \tag{4}$$

As can be seen from equation 4, the voltage increases ΔV across the DC link capacitor 12 can be expressed by time integration of the leakage current flowing into the DC link capacitor 12. Equation 4 is rearranged as equation 5.

$$i = \frac{C\Delta V}{t} \tag{5}$$

As described above with reference to FIG. 3B, a part (i.e., i) of the leakage current flowing through the stray capacitance 200, the AC power supply 3, and the converter 11 flows into the DC link capacitor 12 and the rest flows through the inverter 13-1. The ratio of the leakage current i flowing into the DC link capacitor 12 and the leakage current flowing through the inverter 13-1 is approximately the inverse of the impedance ratio between the DC link capacitor 12 and the inverter 13-1. In other words, the leakage current I flowing through the stray capacitance 200, the AC power supply 3, and the converter 11 and the leakage current i flowing into the DC link capacitor 12 are in a proportional relation. Equation 6 holds where K is a proportionality coefficient.

$$I=Ki \tag{6}$$

By substituting equation 5 into equation 6, equation 7 is obtained.

$$I = \frac{K\Delta V}{t} \tag{7}$$

As can be seen from equation 7, the leakage current I flowing through the stray capacitance 200, the AC power supply 3, and the converter 11 is proportional to the difference calculated by the calculation unit 17 (i.e., the amplitude of fluctuation in the value of DC voltage applied across the DC link capacitor 12 as compared with the peak value of AC voltage on the AC input side of the converter 11, which is the "voltage increase across the DC link capacitor 12). Hence, according to the present embodiment, the leakage current determination unit 19 determines that the inverter that is associated with the greatest difference calculated by the calculation unit 17 is the inverter that has caused the largest leakage current.

FIG. 7 to FIG. 10 illustrate results of simulation analysis conducted on the series of operations described above with reference to FIGS. 4 to 6. The simulation was conducted in a setting such that switching devices in the inverter 13-1 perform switching operations at certain time intervals while the converter 11 converting the AC power inputted by the AC power supply 3 to DC power and outputting the DC power to the DC link. The capacitance $C_{MOTOR}$ of the stray capacitance 200 was set to be smaller than the total capacitance ($C_{PG}+C_{NG}$) of the Y capacitors 31P and 31N.

Figure 7:
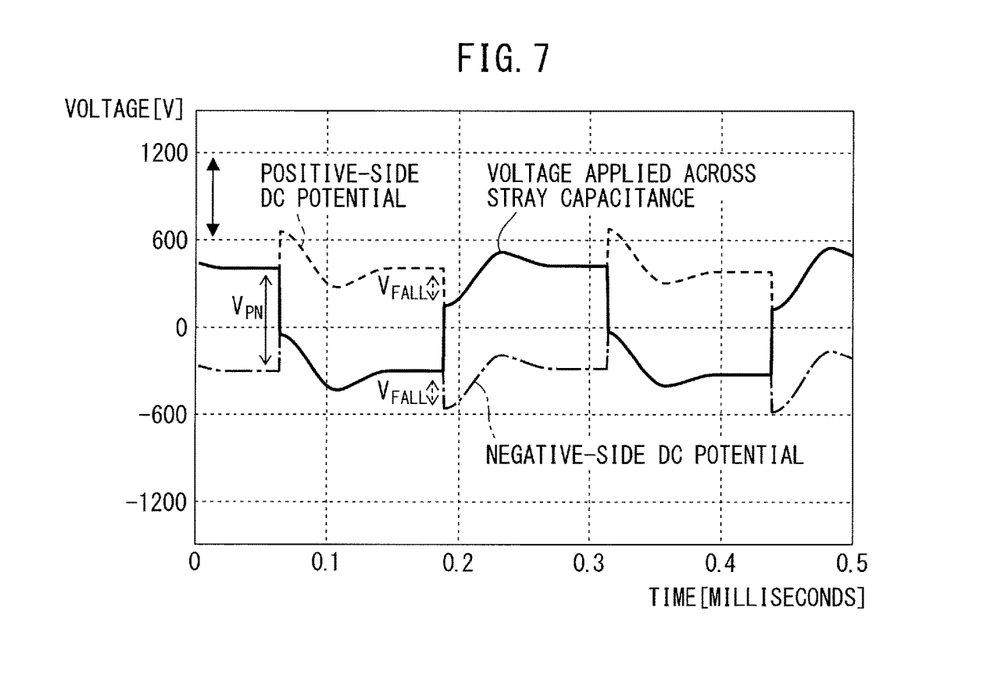
FIG. 7 illustrates a result of simulation of a voltage fluctuation across the DC link capacitor caused by an occurrence of leakage current.

FIG. 7 illustrates a result of simulation of a voltage fluctuation across the DC link capacitor caused by an occurrence of leakage current. In FIG. 7, dashed lines denote the positive-side DC potential of the DC link relative to the ground potential, long dashed short dashed lines denote the negative-side DC potential of the DC link relative to the ground potential, and continuous lines denote the voltage applied across the stray capacitance 200. As can be seen from FIG. 7, when no AC driving current is flowing through the motor 2-1, the positive-side DC potential or the negative-side DC potential of the DC link relative to the ground potential is applied across the stray capacitance 200. When, for example, the switching devices for all three phases on the lower arm of the inverter 13-1 are on and the switching devices for all three phases on the upper arm are off, the negative-side DC potential of the DC link relative to the ground potential is applied across the stray capacitance 200. When the operation of the switching devices shifts from the state in which the switching devices for all three phases on the lower arm of the inverter 13-1 are on and the switching devices for all three phases on the upper arm are off to the state in which the switching devices for all three phases on the lower arm are off and the switching devices for all three phases on the upper arm are on, the voltage applied across the stray capacitance 200 changes from the negative-side DC potential to the positive-side DC potential of the DC link relative to the ground potential, which appears in the simulation result illustrated in FIG. 7. During this change the stray capacitance 200 accumulates a charge, which is owing to the discharge by the DC link capacitor 12 and the Y capacitor 31P. Note that the capacitance of the DC link capacitor 12 is far greater than the capacitance of the Y capacitor 31P and the voltage applied across the DC link capacitor 12 $V_{PN}$ changes little. Accordingly, the transfer of charges between the stray capacitance 200 and the Y capacitors 31P and 31N appears as a phenomenon that the positive-side DC potential and the negative-side DC potential of the DC link relative to the ground potential change in the same direction by the same amount, as illustrated in FIG. 7.

Figure 8:
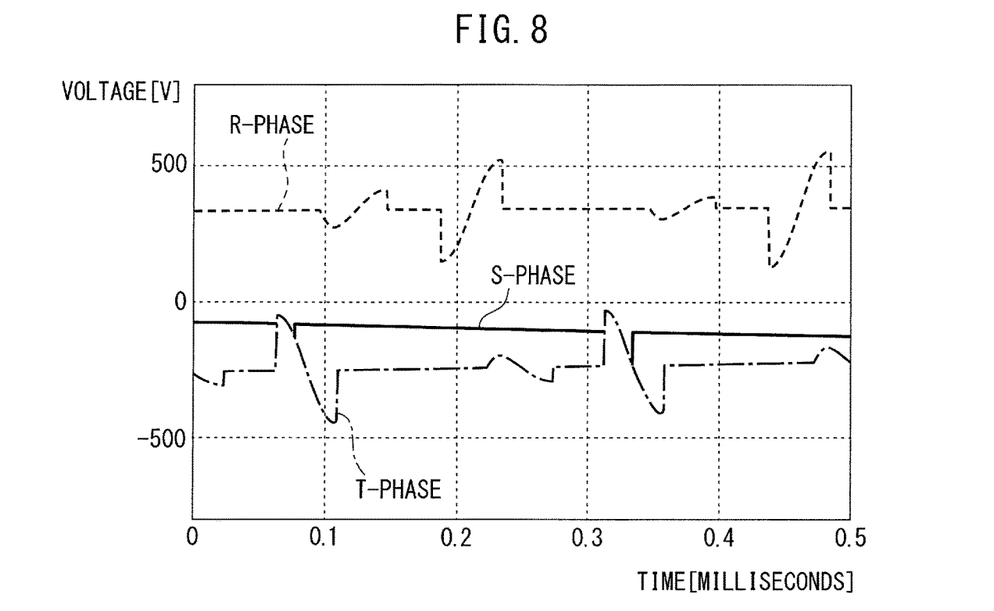
FIG. 8 illustrates a result of simulation of fluctuations in AC voltage on the AC input side of the converter caused by an occurrence of leakage current.

FIG. 8 illustrates a result of simulation of fluctuations in AC voltage on the AC input side of the converter caused by an occurrence of leakage current. In FIG. 8, dashed lines denote the R-phase AC voltage on the AC input side of the converter 11, continuous lines denote the S-phase AC voltage on the AC input side of the converter 11, and long dashed short dashed lines denote T-phase AC voltage on the AC input side of the converter 11. As described above with reference to FIG. 5, when the positive-side DC potential and the negative-side DC potential of the DC link relative to the ground potential fluctuate, a voltage is applied across the AC reactors 21 depending on the amplitude of fluctuation, and this appears as fluctuations in R-phase, S-phase, and T-phase AC voltages in the simulation result illustrated in FIG. 8.

Figure 9:
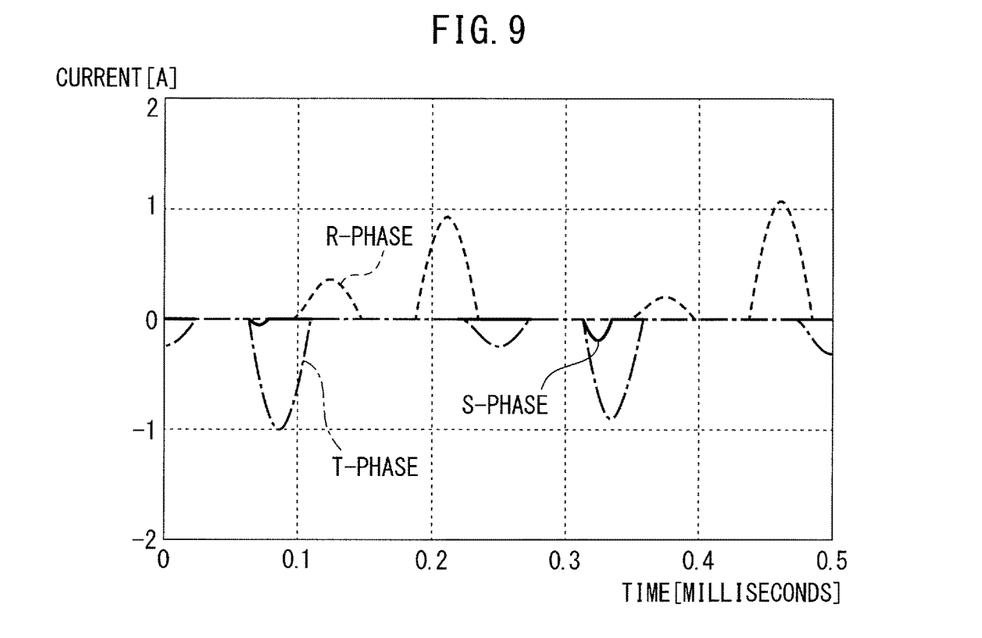
FIG. 9 illustrates a result of simulation of flows of AC current through AC reactors on the AC input side of the converter caused by an occurrence of leakage current.

FIG. 9 illustrates a result of simulation of flows of AC current through AC reactors on the AC input side of the converter caused by an occurrence of leakage current. In FIG. 9, dashed lines denote the AC current flowing through the R-phase AC reactor 21 on the AC input side of the converter 11, continuous lines denote the AC current flowing through the S-phase AC reactor 21 on the AC input side of the converter 11, and long dashed short dashed lines denote the AC current flowing through the T-phase AC reactor 21 on the AC input side of the converter 11. The voltage applied across the AC reactors 21 depending on the amplitude of fluctuation in the positive-side DC potential and the negative-side DC potential of the DC link relative to the ground potential, produces energy in the AC reactors 21 and it can be seen from FIG. 9 there are currents through the R-phase, S-phase, and T-phase AC reactors 21. It can be also seen that, as described above with reference to FIG. 6, there are currents flowing in reverse direction by the effects of the inductance of the Y capacitors 31P and 31N.

Figure 10:
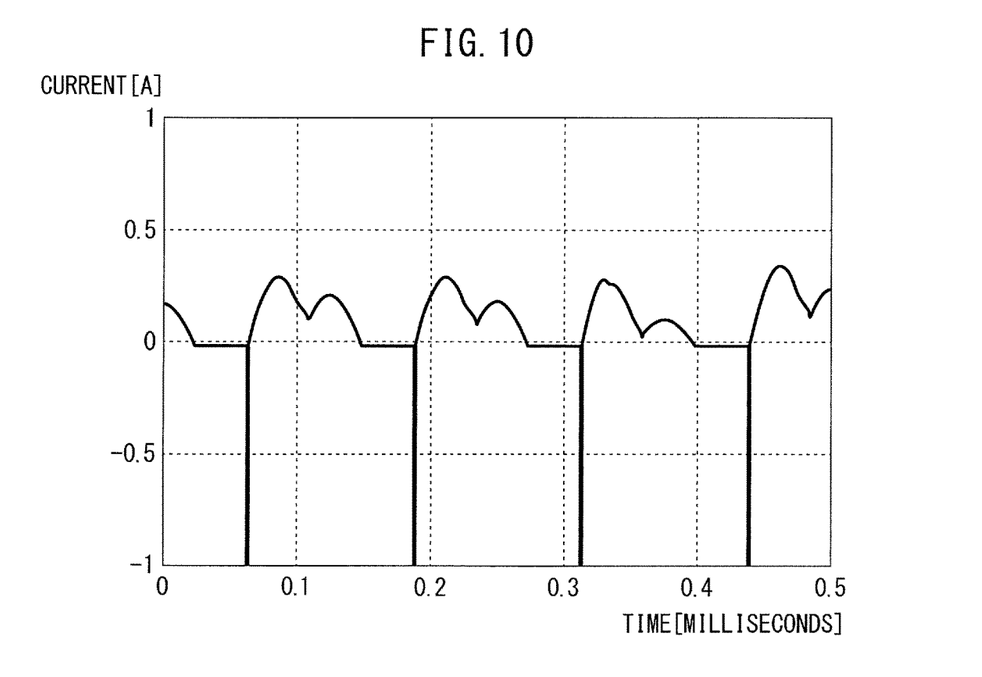
FIG. 10 illustrates a result of simulation of the quantity of charge flowing into the DC link capacitor caused by an occurrence of leakage current.

FIG. 10 illustrates a result of simulation of the quantity of charge flowing into the DC link capacitor caused by an occurrence of leakage current. AC currents flow through the R-phase, S-phase, and T-phase AC reactors 21 owing to the voltage applied across the AC reactors 21 depending on the amplitude of fluctuation in the positive-side DC potential and the negative-side DC potential of the DC link relative to the ground potential, and these AC currents are converted (rectified) by the converter 11 to DC currents and it can be seen from FIG. 10 that these currents appear as charges flowing into the DC link capacitor 12.

As described above with reference to FIGS. 4 to 10, high-speed switching operations by the switching devices in the inverter 13-1 under the presence of stray capacitance 200 cause a leakage current and this leakage current fluctuates the voltage applied across the DC link capacitor 12 (i.e., positive-side DC potential and the negative-side DC potential of the DC link relative to the ground potential). According to one aspect of the present disclosure, the calculation unit 17 calculates the difference between the value of DC voltage detected by the DC voltage detection unit 16 (i.e., value of DC voltage applied across the DC link capacitor 12) and the peak value of AC voltage detected by the AC voltage detection unit 15, and the leakage current determination unit 19 determines that the inverter that is associated with the greatest difference calculated by the calculation unit 17 is the inverter that has caused the largest leakage current.

Figure 11:
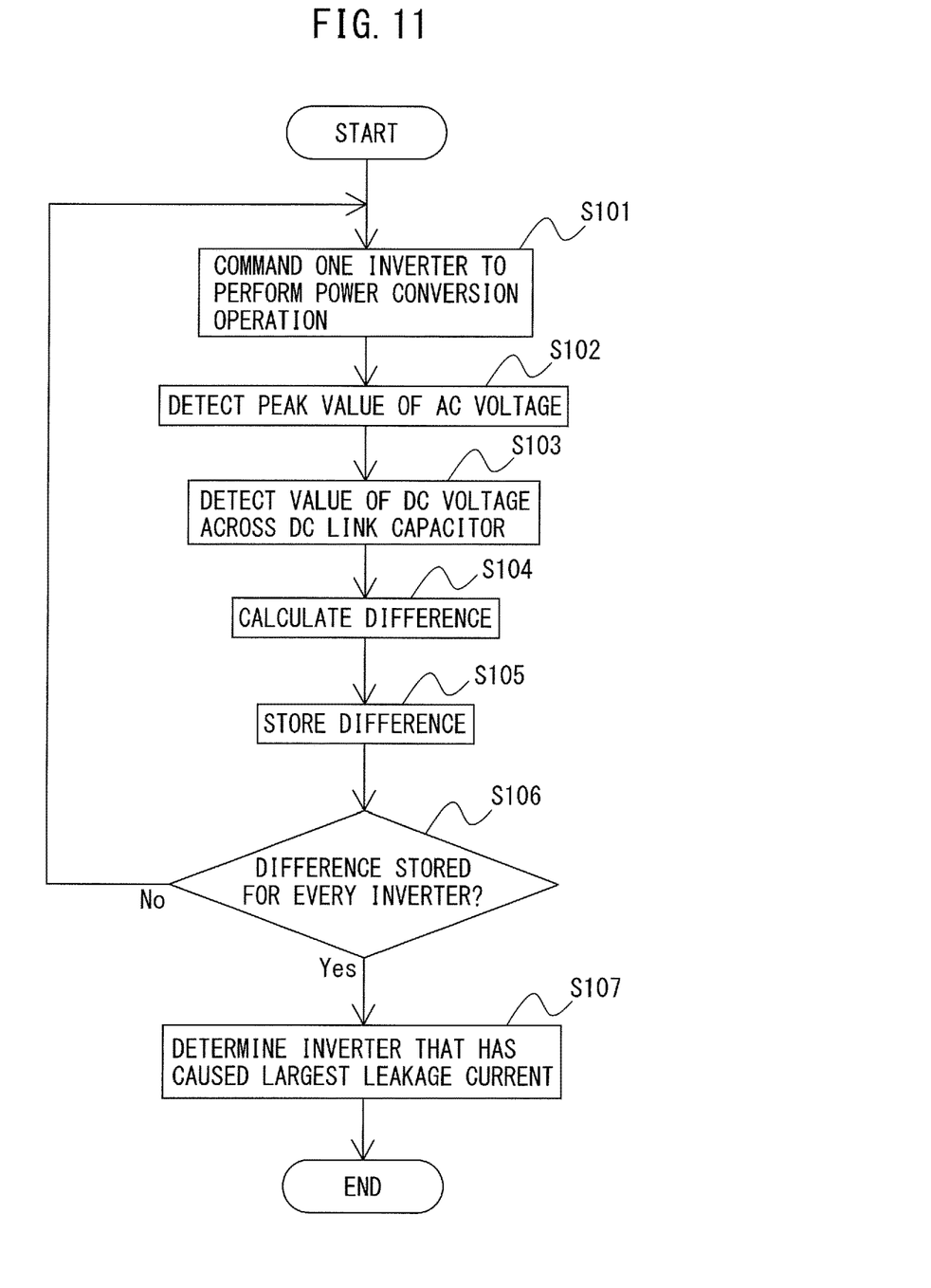
FIG. 11 is a flow chart illustrating an operation process of the motor drive apparatus according to an embodiment.

FIG. 11 is a flow chart illustrating an operation process of the motor drive apparatus according to an embodiment.

The processing for detecting the inverter that has caused the largest leakage current from among the plurality of inverters 13-n can be performed only when the motor drive apparatus 1 is operated in the diagnosis mode. When the motor drive apparatus 1 is operated in the normal operation mode for the motors 2-n, the motor drive apparatus 1 needs to be switched over to the diagnosis mode. The switching from the operation mode to the diagnosis mode is done, for example, by operating certain keys on the operation terminal of a numerical control apparatus connected to the motor drive apparatus 1, by a switching command from a cell controller superordinate to the numerical control apparatus, or by a switching command from a production control apparatus superordinate to the cell controller. In the diagnosis mode, at step S101, the diagnosis command unit 14 outputs a command to one inverter to convert the DC power supplied by the converter 11 via the DC link to an AC driving power by the switching operations of the switching devices in the inverter (on/off switching command) and the diagnosis command unit 14 outputs commands to the inverters other than the one inverter not to convert any DC power supplied by the converter 11 to AC power (i.e., off-only switching command). Thus, only the one inverter that has received the command from the diagnosis command unit 14 performs power conversion operation and only the motor connected to the one inverter is driven.

A high-speed PWM switching control of the one inverter that has received the command from the diagnosis command unit 14 causes a leakage current, which flows through the AC power supply 3, the converter 11, the one inverter, and the stray capacitance 200. The leakage current fluctuates the voltage applied across the DC link capacitor 12, i.e., fluctuates the positive-side DC potential and the negative-side DC potential of the DC link relative to the ground potential. The AC voltage detection unit 15 detects the peak value of AC voltage on the AC input side of the converter 11 at this point in time (step S102), and the DC voltage detection unit 16 detects the value of DC voltage applied across the DC link capacitor 12 at this point in time (step S103). The processing for the detection of the peak value of AC voltage by the AC voltage detection unit 15 at step S102 and the processing for the detection of value of DC voltage applied across the DC link capacitor 12 at step S103 may be executed in reverse order or simultaneously.

At step S104, the calculation unit 17 calculates the difference between the value of DC voltage detected by the DC voltage detection unit 16 and the peak value of AC voltage detected by the AC voltage detection unit 15.

At step S105, the storage unit 18 stores the difference calculated by the calculation unit 17 in association with the identity information of the inverter that had been commanded to perform power conversion operation by the diagnosis command unit 14 when the DC voltage detection unit 16 detected the value of DC voltage used for the calculation of the difference.

At the next step S106, the leakage current determination unit 19 determines whether the processing for storing in the storage unit 18 the difference calculated by the calculation unit 17 when the one inverter that received the command from the diagnosis command unit 14 was performing power conversion operation has been done for every inverter or not. When it is determined that there is an inverter for which such a processing has yet to be done, the process returns to step S101. As the processing from steps S101 to S106 is executed for every inverter one after another, the differences calculated by the calculation unit 17 are stored in the storage unit 18 in association with the identity information of respective inverters that had been commanded to perform power conversion operation by the diagnosis command unit 14 when the DC voltage detection unit 16 detected the values of DC voltage used for the calculation of the differences. Note that the determination processing at step S106 may be executed not by the leakage current determination unit 19 as has been described above but by the diagnosis command unit 14.

At step S107, the leakage current determination unit 19 determines that the inverter stored in association with the largest of the differences stored in the storage unit 18 is the inverter that has caused the largest leakage current. The result of determination by the leakage current determination unit 19 is notified to the user by the notification unit 20. The result of determination by the leakage current determination unit 19 allows the user of the motor drive apparatus 1 to identify easily and accurately the inverter determined to have caused the largest leakage current.

According to one aspect of the present disclosure, it is possible to detect easily and accurately the combination of an inverter and a motor that causes the largest leakage current in a motor drive apparatus in which a plurality of inverters are used to supply driving power to a plurality of motors.

The invention claimed is:
1. A motor drive apparatus comprising:
  a converter configured to convert AC power inputted by an AC power supply to DC power and to output the DC power to a DC link;
  a DC link capacitor provided for the DC link;
  a plurality of inverters respectively provided for motors and configured to perform power conversion operation in accordance with a command received to convert the DC power in the DC link to AC power for driving the motors;
  a diagnosis command unit configured to execute processing for giving a command to only one inverter of the plurality of inverters at a time to perform the power conversion operation and to repeat the processing for the other inverters of the plurality of inverters one after another;
  an AC voltage detection unit configured to detect a peak value of AC voltage on an AC input side of the converter;
  a DC voltage detection unit configured to detect a value of DC voltage applied across the DC link capacitor;
  a calculation unit configured to calculate a difference between the value of DC voltage detected by the DC voltage detection unit and the peak value of AC voltage detected by the AC voltage detection unit;
  a storage unit configured to store the difference calculated by the calculation unit in association with the inverter that had been commanded by the diagnosis command unit to perform the power conversion operation when the value of DC voltage used for the calculation of the difference was detected by the DC voltage detection unit; and
  a leakage current determination unit configured to determine that the inverter stored in association with the largest of the differences stored in the storage unit is the inverter that has caused the largest leakage current.

2. The motor drive apparatus according to claim 1, further comprising a notification unit configured to notify identity information of the inverter determined by the leakage current determination unit to have caused the largest leakage current.

* * * * *